(12) United States Patent  (10) Patent No.: US 7,123,177 B2
Cheng et al.  (45) Date of Patent: Oct. 17, 2006

(54) SYSTEM AND METHOD FOR STABILIZING HIGH ORDER SIGMA DELTA MODULATORS

(75) Inventors: Taiyi Cheng, San Jose, CA (US); Josephus van Engelen, Aliso Viejo, CA (US); Minsheng Wang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 90 days.

(21) Appl. No.: 10/640,633

(22) Filed: Aug. 14, 2003

(65) Prior Publication Data

US 2005/0038847 A1  Feb. 17, 2005

(51) Int. Cl.
*H03M 3/00* (2006.01)
(52) U.S. Cl. ...................... 341/143; 341/161
(58) Field of Classification Search ........ 341/143–161, 341/44, 163
See application file for complete search history.

(56) References Cited

U.S. PATENT DOCUMENTS

| | | | | |
|---|---|---|---|---|
| 3,824,466 | A * | 7/1974 | Olier et al. ................. | 375/272 |
| 5,243,345 | A | 9/1993 | Naus et al. ................. | 341/143 |
| 5,585,801 | A * | 12/1996 | Thurston .................... | 341/143 |
| 5,668,552 | A * | 9/1997 | Thurston .................... | 341/143 |
| 5,977,895 | A * | 11/1999 | Murota et al. .............. | 341/143 |
| 6,064,700 | A * | 5/2000 | Noguchi et al. ............ | 341/141 |
| 6,300,892 | B1 * | 10/2001 | Braun ........................ | 341/144 |
| 6,344,811 | B1 * | 2/2002 | Melanson ................... | 341/143 |
| 6,400,297 | B1 * | 6/2002 | Tucker ....................... | 341/143 |
| 6,489,907 | B1 * | 12/2002 | Cusinato et al. ........... | 341/143 |
| 6,621,435 | B1 * | 9/2003 | Cusinato et al. ........... | 341/143 |
| 6,822,592 | B1 * | 11/2004 | Gandolfi et al. ........... | 341/143 |

OTHER PUBLICATIONS

Engelen, J., "A 13-bit bandpass sigma delta modulator for 10.7MHz digital IF with a 40 MHz sampling rate," R.J. van de plassche et al. (eds), *Analog Circuit Design*, Kluwer Academic Publishers, Netherlands, pp. 119-138 (2000) Feb. 2000.
Jiang, R. et al., "A 1.8V 14b ΔΣ A/D Converter with 4MSamples/s Conversion," IEEE International Solid-State Circuits Conference 2002/Session 13 / Oversampling A/D Converters (Feb. 5, 2002).
Marques, A. et al., "Optimal Parameters for ΔΣ Modular Topologies," IEEE *Transactions on Circuits and Systems-II: Analog and Digital Signal Processing*, 45(9):1232-1241 (Sep. 1998).

(Continued)

*Primary Examiner*—Lam T. Mai
(74) *Attorney, Agent, or Firm*—Sterne Kessler Goldstein & Fox PLLC

(57) ABSTRACT

A system and method is provided for stabilizing high order sigma delta modulators. The system includes an integrator having a limiter in the feedback path of the integrator. The integrator combines an input signal with a feedback signal generated by the limiter to produce an integrated output signal. The output signal is output to the next component of the sigma delta modulator. In addition, the output signal is fed back through the limiter. When an output signal received in the feedback path by the limiter exceeds the threshold value of the limiter, the limiter is activated and clamps the output signal to produce a limited signal. The limited signal is combined with the input signal to the integrator to produce the output signal.

14 Claims, 12 Drawing Sheets

OTHER PUBLICATIONS

Geerts, Y. et al., "A High-Performance Multibit ΔΣ CMOS ADC," *IEEE Journal of Solid-State Circuits*, 35(12): 1829-1840 (Dec. 2000).

Baird, R.T. et al., "Stability Analysis of High-Order Delta-Sigma Modulation for ADC's," *IEEE Transactions on Circuits and Systems-II: Analog and Digital Signal Processing*, 41(1):59-62 (Jan. 1994).

Stikvoort, E.F., "Some Remarks on the Stability and Performance of the Noise Shaper or Sigma-Delta Modulator," *IEEE Transactions on Communications*, 36(10):1157-1162 (Oct. 1998).

Annovazzi, M. et al., A Low-Power 98-dB Multibit Audio DAC in a Standard 3.3-V 0.35-μm CMOS Technology, *IEEE Journal of Solid-State Circuits*, 37(7):825-834 (Jul. 2002).

Ritoniemi, T. et al., "Design of Stable High Order 1-Bit Sigma-Delta Modulators," *IEEE*, pp. 3267-3270, Mar. 1990.

vander Zwan, E.J., "A 2.3mW CMOS ΔΣ Modulator for Audio Applications;" 1997 *IEEE International Solid State Circuits Conference*, ISSCC 97, Oversampling Data Converters / Paper FP 13.7; pp. 220, 221 and 461 (Feb. 7, 1997).

V. Engelen, J. et al., "Bandpass Sigma Delta Modulators: Stability, Performance and Design Aspects" Kluwer Academic Publishers, Netherlands, pp. 1-181, Jun. 1999.

Norsworthy, S. et al., "Delta-Sigma Data Converters: Theory, Design, and Simulation" *IEEE*, John Wiley and Sons, Inc., pp. 1-476, Aug. 1997.

Schreier, R. "The Delta-Sigma Toolbox Version 5.2, " ftp://ftp.mathworks.com/pvo/contrib/vs/control/delsig/ (Jun. 7, 2000).

Jiang, R., "Design of a 1.8-V 14-bit Δ—Σ A/D Converter with 8X Oversampling and 4 MHz Nyquist Output Rate," Ph.D Disseration, Oregon State University (Jul. 30, 2001).

Brandt, B.P., "Oversampled analog-to-digital conversion," Ph.D. Dissertation, Stanford University, UMI, Michigan (Aug. 2001).

Schreier, R., "The Delta-Sigma Toolbox Version 6.0," Analog Devices Inc. (Jan. 1, 2003).

\* cited by examiner

SYSTEM AND METHOD FOR STABILIZING HIGH ORDER SIGMA DELTA MODULATORS

FIELD OF THE INVENTION

The present invention is related to data communications networks and modulation. More particularly, the present invention is related to techniques for stabilizing high order sigma delta modulators.

BACKGROUND OF THE INVENTION

Modern communications technologies rely on the ability of equipment to quickly and efficiently convert data between analog and digital formats. As a result, analog-to-digital converters (ADCs) and digital-to-analog converters (DACs) have become central components in a wide variety of applications. As these applications have become increasingly sophisticated, the demand for greater bandwidth and resolution from their ADCs and DACs has risen dramatically.

At a high level, an ADC receives an analog signal and produces a digital signal and a DAC receives a digital signal and produces an analog signal. In an ADC, the digital signal comprises a sequence of discrete quantized values that, over time, track the parameter variations of the analog signal. Quantization error is an unwanted byproduct of this quantization process. DAC and ADC are characterized by their sampling frequency and degree of resolution. The ability of a converter to digitize an analog signal faithfully is a direct function of both of these parameters. As the sampling frequency is increased, the analog signal is sampled at more points in time. As the degree of resolution is refined, differences between the digital signal and analog signal are minimized.

Many distinct architectures exist for DACs and ADCs including "flash," "pipelined," "successive approximation," and "sigma delta" architectures. Each architecture has benefits and drawbacks. Paramount among these is a tradeoff between bandwidth and degree of resolution. Of these architectures, sigma delta converters have exhibited the best balance between bandwidth and resolution.

A conventional sigma delta converter includes a sigma delta modulator followed by a decimator. The sigma delta modulator samples the input signal at a rate that is much faster than the Nyquist rate. The use of oversampling combined with noise shaping functionality allows a sigma delta modulator to move most of the quantization noise outside the band of the signal. The decimator then reduces the frequency of the resultant output and filters the out of band noise.

FIG. 1 illustrates a conventional first-order, single-stage, single-bit sigma delta modulator 100. A sigma delta modulator can be included in either a ADC or a DAC. In addition, a sigma delta modulator can have either an analog or a digital implementation. A single converter can contain an analog or digital sigma delta modulator or both. Sigma delta modulator 100 includes a summing node 110, an integrator 120, a single-bit quantizer 150, and a converter 160. Summing node 110, integrator 120, and quantizer 150 are connected, respectively, in series along signal path 108. Converter 160 is connected in parallel with signal path 108 between node $N_O$ 104 and summing node $\Sigma_O$ 110.

Initially, a signal x[n] passes through summing node 110 and is sampled by integrator 120. Integrator 120 integrates signal x[n] over a given period of time to produce an integrated signal v[n]. Integrated signal v[n] is transmitted to single-bit quantizer 150. Single-bit quantizer 150 rounds integrated signal v[n] to the closest of two preset levels (i.e., a single bit) to produce a quantized signal y[n]. To minimize the difference between quantized signal y[n] and signal x[n], quantized signal y[n] is transmitted to converter 160 and converted to produce an feedback signal fbk[n], which is fed back to summing node 110.

At summing node 110, feedback signal fbk[n] is subtracted from signal x[n] to produce an difference signal u[n]. Difference signal u[n] passes into integrator 120 and the process described above is repeated. Essentially, integrator 120 integrates the difference between quantized signal y[n] and signal x[n]. Over a large number of samples, integrator 120 forces this difference to approach zero. Thus, signal x[n] is received by modulator 100 and converted into quantized signal y[n], produced at node $N_O$ 104. The quantized signal y[n] comprises a stream of quantized values. Typically, this stream is produced at a modulator frequency that is several times greater than the carrier frequency of analog signal x[n]. The ratio of the modulator frequency to the Nyquist frequency is referred to as the oversampling ratio.

Signal-to-noise ratio (SNR) is an important measurement in a sigma-delta converter because a higher SNR translates into smaller distortion between digital and analog signals. In a sigma delta modulator, the SNR improves when the oversampling ratio is increased. For example, as a "rule of thumb," the SNR for an ADC improves by 9 dB for every doubling of its oversampling ratio. The use of high-order sigma delta modulators further improves the SNR. As a result, high-order single-loop sigma delta modulators are desirable for high SNR applications such as digital voice and audio.

High-order sigma delta modulators can be implemented using a wide variety of architectures. For example, a sigma delta modulator could have either a single stage or cascaded (also known as MASH) architecture. In a cascaded architecture, two or more low-order sigma delta modulators are coupled to produce a high-order sigma delta modulator. A modulator is considered high-order if it contains 3 or more integrator segments. A detailed explanation of the various high-order architectures is provided in the book "Delta-Sigma Data Converters—Theory, Design and Simulation," Norsworthy et al., IEEE Press, Piscataway, N.J. (1997), which is incorporated herein by reference in its entirety.

A high-order single stage single-loop sigma delta modulator can either follow a multiple feed forward topology or a multiple feedback topology. FIG. 2 is a block diagram of a third-order single-loop sigma delta modulator 200 having a multiple feed forward topology. Modulator 200 has a first summing node 210, a first integrator 220, a second integrator 230, a third integrator 240, a second summing node 212, and a quantizer 150 connected, respectively, in series along signal path 208. A first amplifier 272 is connected in parallel with signal path 208 between node $N_1$ 206 and the second summing node 212. A second amplifier 274 is connected in parallel with signal path 208 between node $N_2$ 207 and the second summing node 212. A third amplifier 276 is connected in parallel with signal path 208 between node $N_O$ 104 and the first summing node 210.

Referring to FIG. 2, signal x[n] passes through the first summing node 210 and is sampled by the first integrator 220. First integrator 220 produces an integrated signal $v_1[n]$. Integrated signal $v_1[n]$ is transmitted to second integrator 230 and to first amplifier 272. First amplifier amplifies the signal by $c_1$ and generates signal $v_{c1}[n]$. The second integrator 230 integrates signal $v_1[n]$ over a given period of time to produce an integrated signal $v_2[n]$. Integrated signal $v_2[n]$ is transmitted to third integrator 240 and to second amplifier 274. Second amplifier 274 amplifies the signal by $c_2$ and generates signal $v_{c2}[n]$. The third integrator 240 integrates the signal $v_2[n]$ over a given period of time to produce an integrated signal $v_3[n]$.

At the second summing node 212, integrated signal $v_3[n]$ is added to amplified signals $v_{c1}[n]$ and $v_{c2}[n]$ resulting in signal $w[n]$. Signal $w[n]$ is input to single-bit quantizer 150. Single-bit quantizer 150 produces a quantized signal $y[n]$. Quantized signal $y[n]$ is transmitted to third amplifier 276 and amplified by $C_3$ to produce a feedback signal $fbk[n]$, which is fed back to the first summing node 210. At the first summing node 210, feedback signal $fbk[n]$ is subtracted from signal $x[n]$ to produce a difference signal $u[n]$. Difference signal $u[n]$ passes into the first integrator 220 and the process described above is repeated.

FIG. 3 is a block diagram of a third-order single-loop sigma delta modulator 300 having a multiple feedback topology. Modulator 300 comprises a first summing node 310, a first integrator 320, a first amplifier 372, a second summing node 314, a second integrator 330, a second amplifier 374, a third summing node 316, a third integrator 340, and a quantizer 150 connected, respectively, in series along signal path 308. A gain amplifier 378 is connected in parallel with signal path 308 between node $N_1$ and the second summing node 314. A third amplifier 376 is connected in parallel with signal path 308 and feds back a signal to the first, second, and third summing nodes 310, 314, 316.

The integrators shown in FIG. 1 through 3 can either be digital integrators or analog integrators. Many architectures exist for implementing analog and digital integrators. FIG. 4A is a block diagram illustrating an exemplary architecture for a conventional digital integrator 420. Digital integrator 420 comprises an adder 422 and a delay 424. The delayed output of the adder 422 is fed back to the adder 422 along signal path 426.

Conventional analog integrators are typically implemented using either a switch-capacitor or a continuous time design. FIG. 4B illustrates an exemplary switch-capacitor analog integrator 430. Integrator 430 includes an operational amplifier (op amp) 432, a first capacitor 434, a second capacitor 436, phase 1 switches S1 and S4, and phase 2 switches S2 and S3. Switch S1, first capacitor 434, and Switch S4 are connected, respectively, in series between the input of the integrator and the inverting (negative) terminal of op amp 432. Second capacitor 436 is connected between the inverting terminal of op amp 432 and the op amp output. Switch S2 is connected between $N_1$ and ground. S4 is connected between $N_2$ and ground.

The $3^{rd}$ order single-loop sigma-delta modulators shown in FIG. 2 and FIG. 3 achieve 14-bit resolution with an oversampling ratio of 40. The multiple feedback topology of FIG. 3 is especially useful for digital sigma-delta modulation since the one-bit feedback could make its implementation multiplier free. Notwithstanding these benefits, all high-order sigma delta modulators are susceptible to instability. When a large signal is received as input to the modulator, the internal filter states of the modulator exhibit large signal oscillation. The modulator then produces an output of alternating long strings of 1's or 0's. The signal-to-noise-plus-distortion ratio (SNDR) drops dramatically when the sigma delta modulator is operating in an unstable state. A detailed explanation of the stability problem is provided in the book "Delta-Sigma Data Converters—Theory, Design and Simulation," Norsworthy et al., referenced above.

A current technique for addressing the stability problem is the integrator reset technique. This technique is frequently used when an analog switch capacitor integrator is built using CMOS technology. In this technique, the modulator determines when instability exists and triggers a short pulse to reset the integrator. One method for determining the existence of instability is through the use of a comparator. In another method, modulator instability is detected when a sufficiently long string of 1's or 0's occurs at the output of the modulator. When instability is detected, the integrator is reset with a short pulse. If the frequency of the reset event is lower than the cut-off frequency of the subsequent filter, a large amount of noise may appear at the output of the modulator.

Another current technique for addressing the stability problem is the state-variable clamping technique. In the state-variable clamping technique, a limiter is placed in the forward path of the integrator. FIG. 5A depicts a block diagram of an analog integrator 3530 implementing the state variable stabilizing technique. Analog integrator 530 comprises an op amp 532, a capacitor 536, a limiter 538, and a resistor 533. Limiter 538 has thresholds of +V and −V. When the voltage across capacitor 536 exceeds the limiting voltage threshold, the output of the integrator clamps. Since the output voltage cannot go to the rail, the op amp 532 keeps in the linear region of operation and stability improves.

FIG. 5B depicts a block diagram of a digital integrator 520 implementing the state variable stabilizing technique. The digital integrator 520 comprises an adder 522, a delay 524, and a limiter 528. Similar to the analog integrator 530, the output of the digital integrator is clamped to the limiter value when the input exceeds the limiting threshold. A drawback of the state-variable clamping technique is that the signal path is blocked when the signal level exceeds a certain level, resulting in significantly deteriorated SNDR for large signals.

The current state-variable clamping technique described above is viable for the multiple feed-forward topology illustrated in FIG. 2 where the last integrator is limited in the forward path. When the last integrator degrades into DC, two other feed-forward paths still exist to the output. Thus, when the limiter in the third integrator is active, the $3^{rd}$ order sigma delta modulator shown in FIG. 2 degrades into a $2^{nd}$ order sigma delta modulator. The $2^{nd}$ order sigma delta modulator is stable but it has a lower SNDR. However, this limiting method is not appropriate for the multiple feedback topology shown in FIG. 3. In this topology, when the third integrator degrades to DC and blocks the forward path, no more signal paths to the output of the modulator exist.

A need therefore exists for an integrator that can improve the SNDR when a high-order sigma delta modulator becomes unstable without blocking the input signal path or degrading the input signal into a DC signal.

BRIEF SUMMARY OF THE INVENTION

The present invention is directed to a system and method for stabilizing high order sigma delta modulators. In accordance with embodiments of the present invention, the system comprises an integrator having a limiter in the feedback path. In an embodiment of the present invention, the integrator is a digital integrator comprising an adder connected in series to a delay along the forward signal path. The digital integrator further comprises a limiter connected in parallel with the forward signal path between the output and the adder. The limiter is connected along the feedback path of the integrator.

In another embodiment of the invention, the integrator is an analog integrator comprising an op amp, a capacitor, a first resistor, a second resistor, and a limiter is the feedback path. The second resistor is connected in series with limiter. The second capacitor is connected between the inverting (negative) terminal of the op amp and the output of the op amp, in parallel with the series connection of the second resistor and the limiter. The first resistor is connected between the input of the integrator and the inverting terminal of the op amp. The non-inverting (positive) terminal of the op amp is connected to ground. Voltage, $V_{in}$, is applied to the integrator at the input.

In another embodiment of the invention, the integrator is an analog integrator comprising an op amp, a capacitor, a first resistor, a second resistor, and a limiter is the feedback path. The second resistor is connected in series with limiter. The second capacitor is connected between the inverting (negative) terminal of the op amp and the output of the op amp, in parallel with the series connection of the second resistor and the limiter. The first resistor is connected between ground and the inverting terminal of the op amp. The non-inverting (positive) terminal of the op amp is connected to the input voltage, $V_{in}$.

In an embodiment of the present invention, when the stabilizing system receives an input signal, the input signal is combined with a feedback signal and is delayed by a delay to produce an output signal. The output signal is fed back along feedback path into the limiter. If the output signal does not exceed the threshold of the limiter, the limiter is not activated and the signal passes through to the adder. The signal is then combined with the input signal and the process is repeated. If the output signal exceeds the thresholds of the limiter, the limiter is activated. When the limiter is activated, the limiter clamps the output signal to the threshold value of the limiter. The output of the limiter is then input to adder and combined with the input signal and the process is repeated.

In an embodiment of the present invention, a method for stabilizing high-order sigma delta modulation includes the steps of combining an input signal and a feedback signal to produce a difference signal; integrating the difference signal to obtain an integrated signal; and quantizing the integrated signal to obtain a quantized signal representing a high-order sigma delta modulation of the input signal. The integrating step includes integrating with feedback and limiting the integrating to maximum and minimum voltage threshold values (+V, −V) when integrator feedback voltages exceed the maximum and minimum threshold values.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the pertinent art to make and use the invention.

Figure 1:
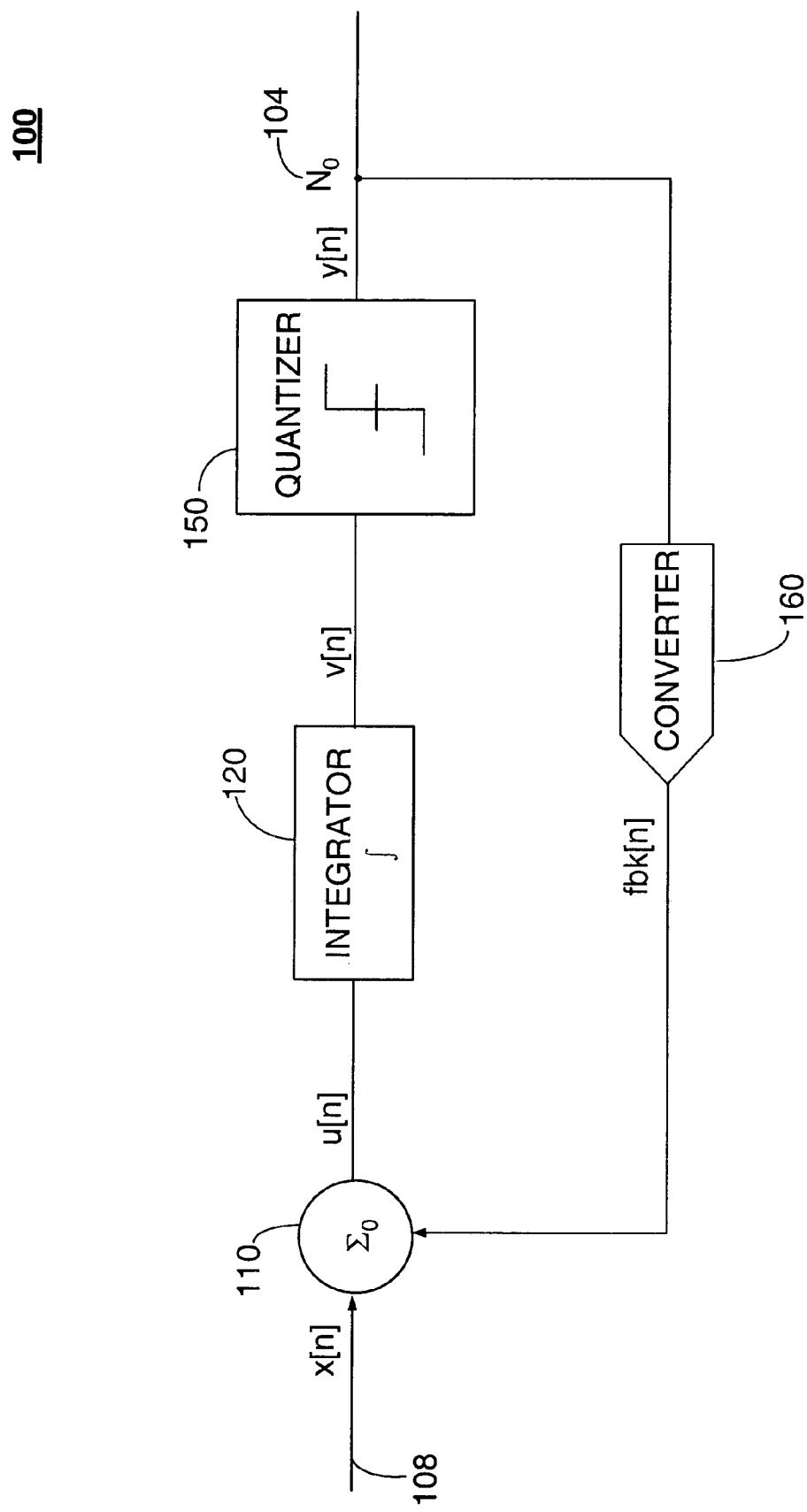
FIG. 1 is a block diagram of a first-order, single-stage, sigma delta modulator.

The features and advantages of the present invention will become more apparent from the detailed description set forth below when taken in conjunction with the drawings in which like reference characters identify corresponding elements throughout. In the drawings, like reference numbers generally indicate identical, functionally similar, and/or structurally similar elements. The drawing in which an element first appears is indicated by the leftmost digit in the corresponding reference number.

DETAILED DESCRIPTION OF THE INVENTION

Figure 2:
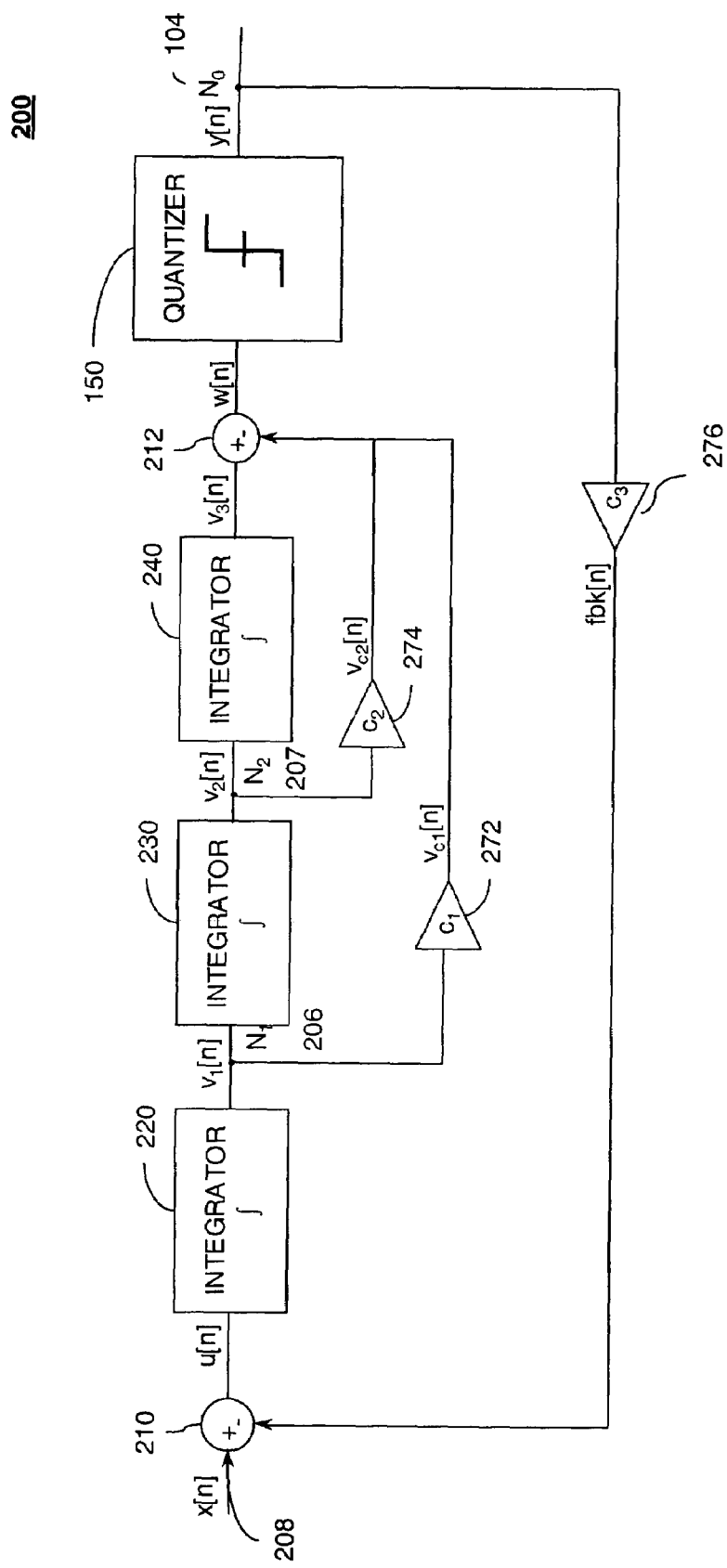
FIG. 2 is a block diagram of a third-order, single-loop sigma delta modulator having a multiple feed forward topology.
Figure 3:
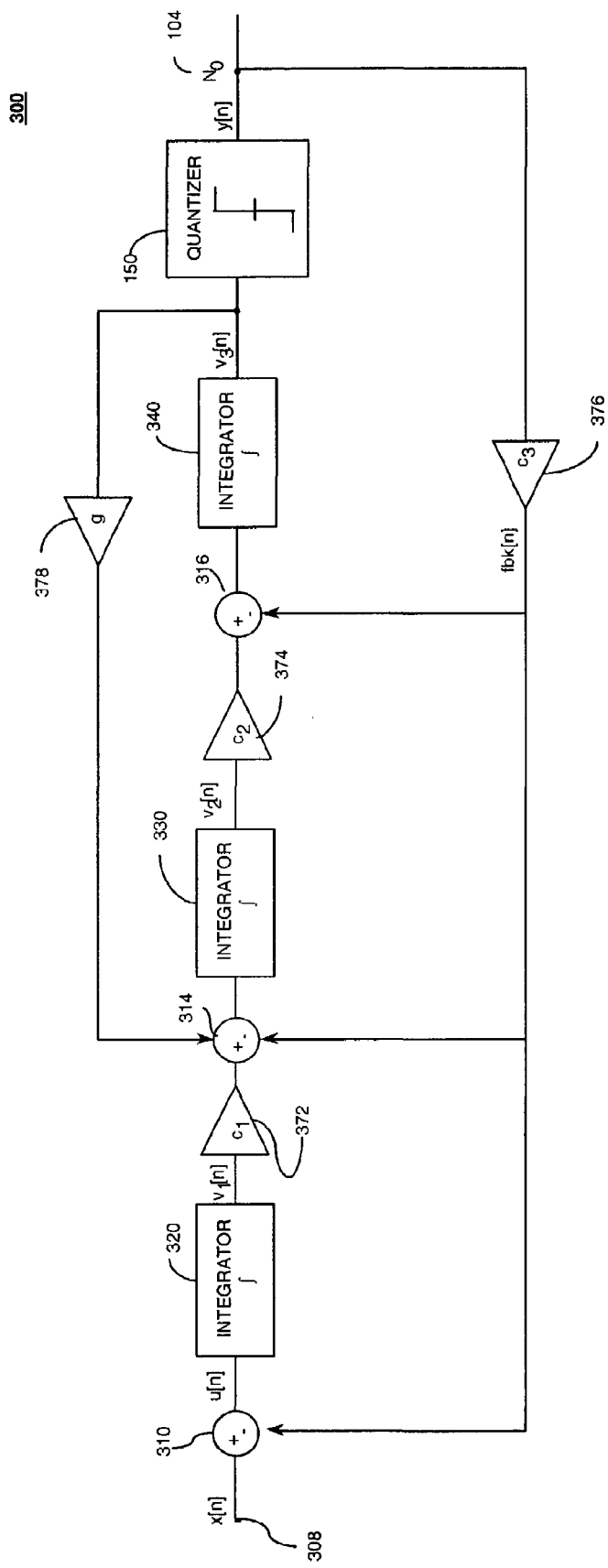
FIG. 3 is a block diagram of a third-order, single-loop sigma delta modulator having a multiple feedback topology.
Figure 4A:
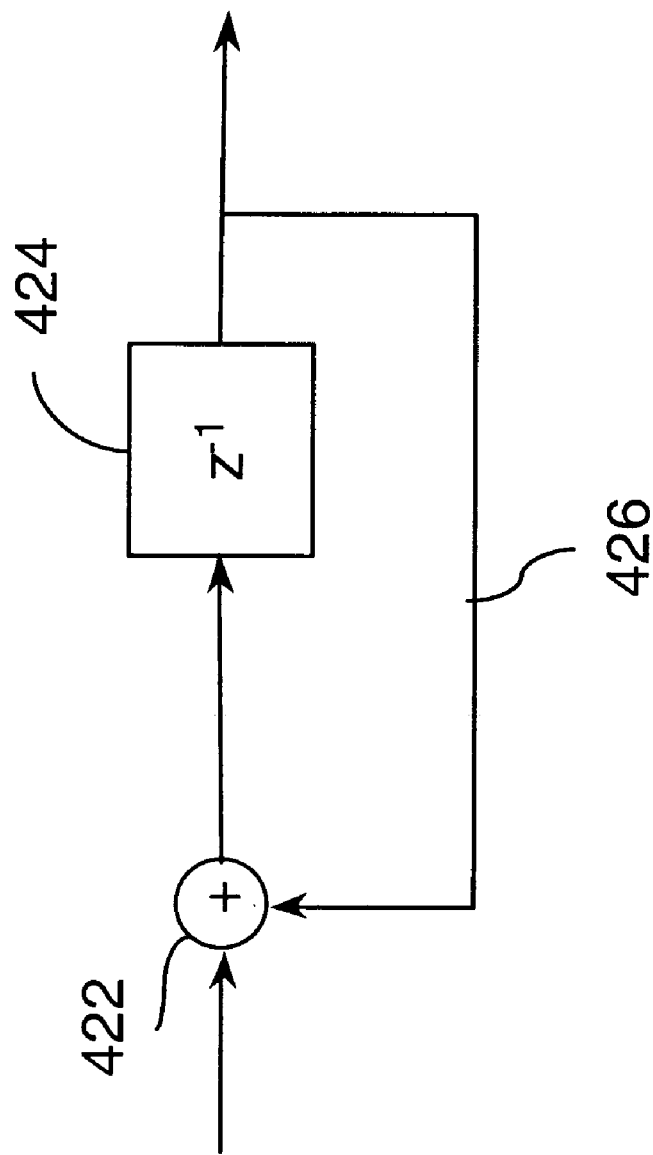
FIG. 4A is a block diagram of a conventional digital integrator.
Figure 4B:
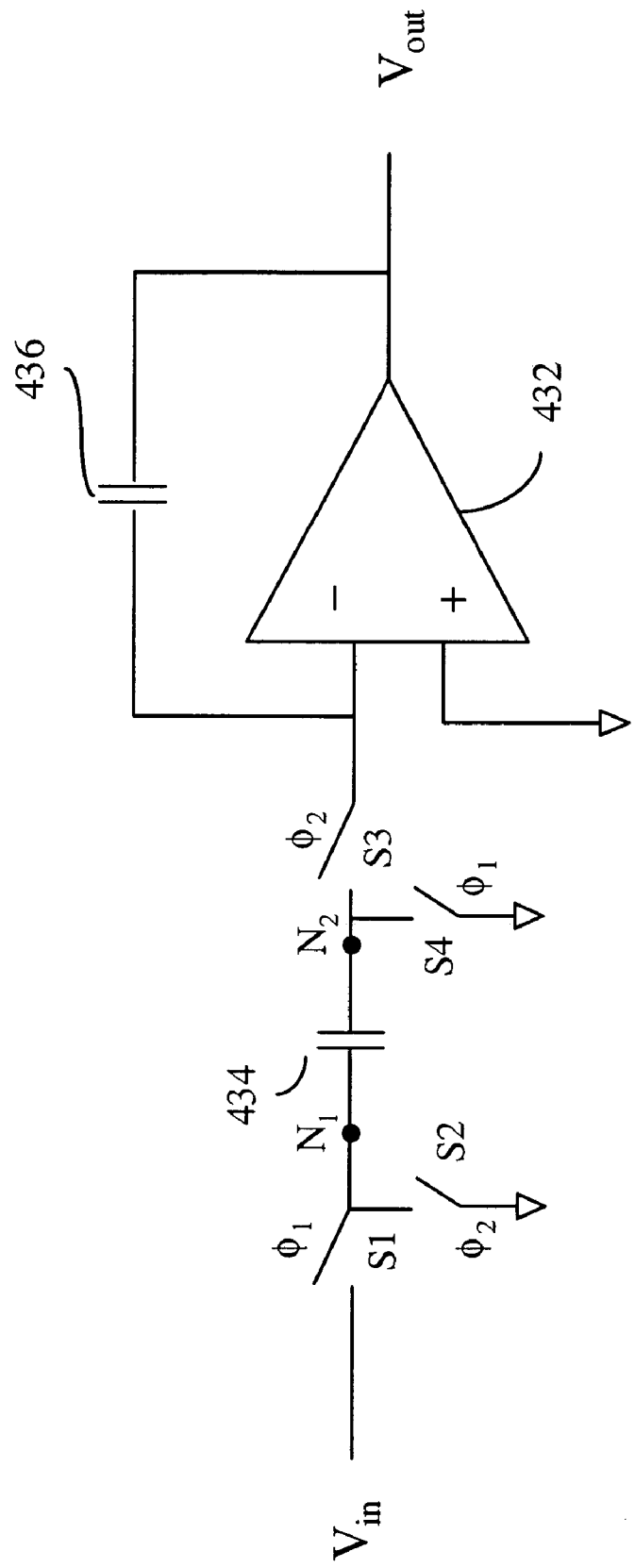
FIG. 4B is a block diagram of a conventional analog switched capacitor integrator.
Figure 5A:
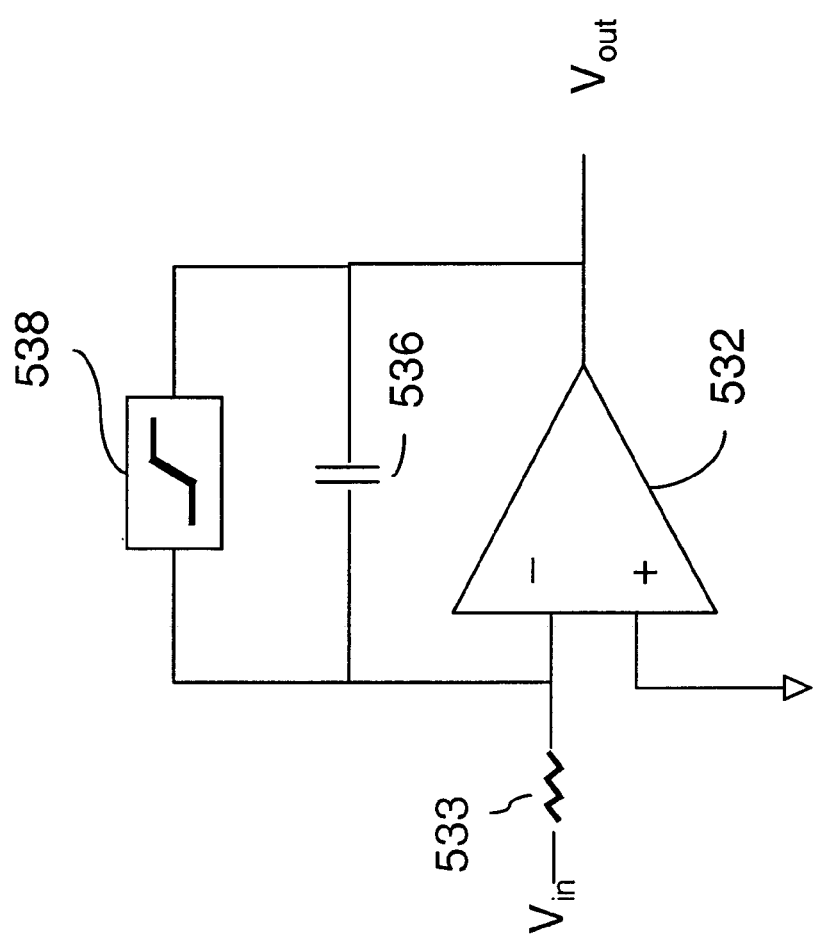
FIG. 5A is a block diagram of an analog switched capacitor integrator implementing the conventional state variable stabilizing technique.
Figure 5B:
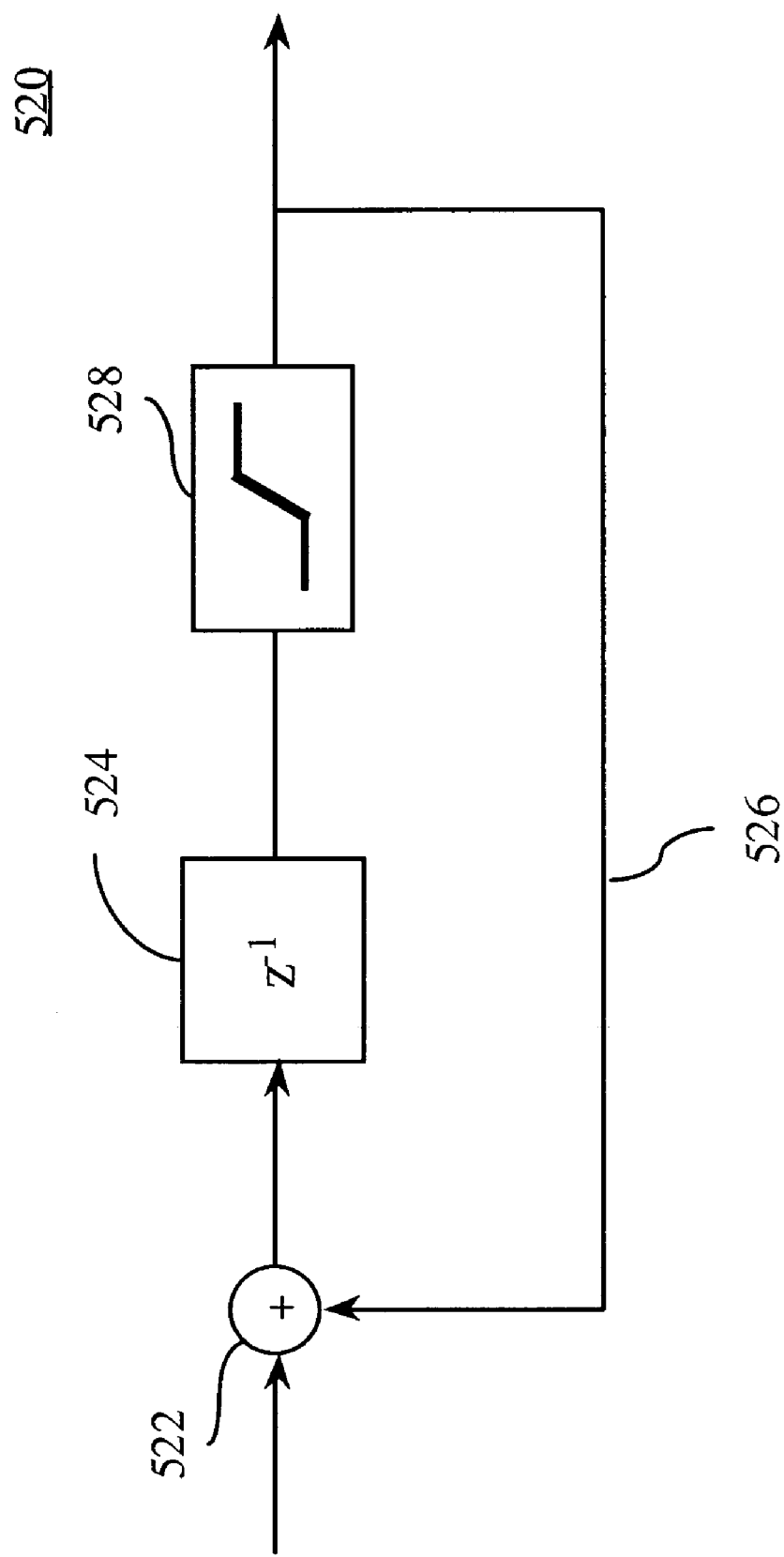
FIG. 5B is a block diagram of a digital integrator implementing the conventional state variable stabilizing technique.
Figure 6:
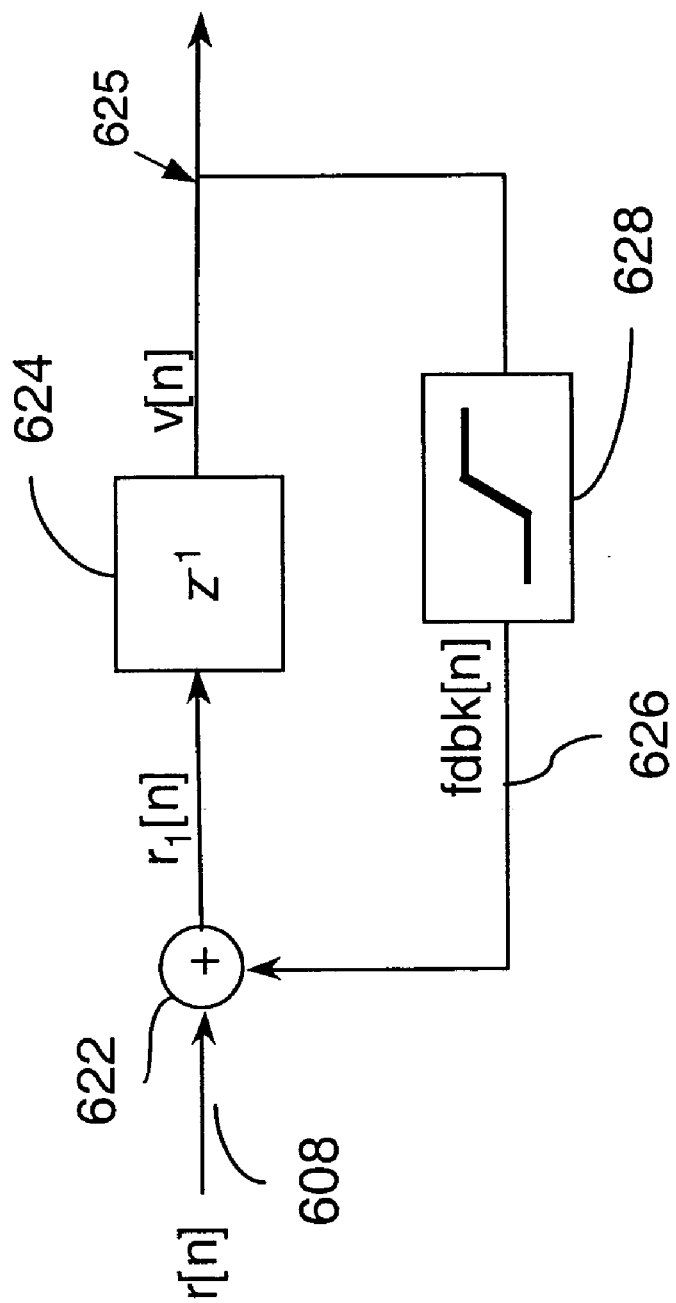
FIG. 6 is a block diagram of a digital integrator having a feedback limiter in accordance with embodiments of the present invention.

FIG. 6 is a block diagram of a digital feedback limiter integrator 620 for stabilizing a sigma delta modulator in accordance with an embodiment of the present invention. Feedback limiter integrator 620 can be implemented in any high order sigma delta modulator architecture including the single loop multiple feed-forward topology shown in FIG. 2 and the multiple feedback topology shown in FIG. 3. In any architecture, one or more of the integrators is replaced with a feedback limiter integrator 620 in accordance with embodiments of the present invention.

FIG. 6 shows an exemplary digital implementation of the feedback limiter integrator 620. Integrator 620 includes an adder 622 and a delay 624 connected in series along signal path 608. The system also comprises a limiter 628 connected along feedback path 626 between output node 625 and adder 622. In feedback limiter integrator 620, limiter 628 is in the feedback path of the integrator. Limiter 628 has threshold values +V and −V, and clamps a received signal to these threshold values when the limiter is active. The threshold values of limiter 628 are set based on the application for which the sigma delta modulator using integrator 620 is designed. Persons skilled in the relevant art(s) will recognize that configurations and arrangements other than those provided in FIG. 6 can be used without departing from the spirit and scope of the present invention.

Figure 7:
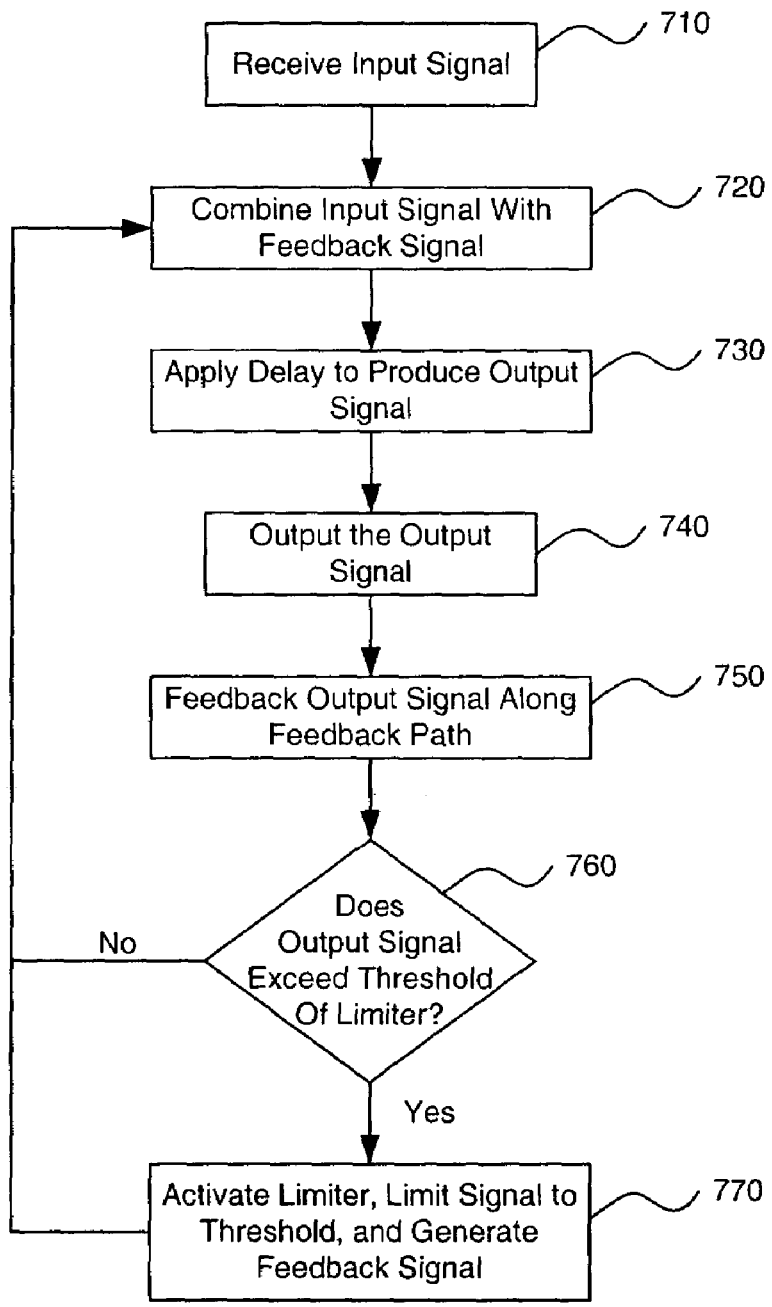
FIG. 7 is a flowchart illustrating a method for stabilizing a sigma delta modulator in accordance with embodiments of the present invention.

FIG. 7 depicts a flowchart 700 of a method for stabilizing a high order sigma delta modulator using a digital feedback limiter integrator in accordance with embodiments of the present invention. The invention, however, is not limited to the description provided by the flowchart 700. Rather, it will be apparent to persons skilled in the relevant art(s) from the teachings provided herein that other functional flows are within the scope and spirit of the present invention. The flowchart 700 will be described with continued reference to the exemplary digital feedback limiter integrator 620 described in reference to FIG. 6, above. However, the invention is not limited to that embodiment.

The method starts when integrator 620 receives an input signal, r[n] (step 710). In step 720, the input signal, r[n], is combined with feedback signal, fdbk[n] in adder 622 to produce signal $r_1[n]$. Signal $r_1[n]$ is then delayed by delay 624 to produce integrator output signal v[n] (step 730). The output signal v[n] is then output (step 740). In step 750, the output signal, v[n], is also fed back along feedback path 626 into limiter 628. The integrator next determines whether the output signal exceeds the thresholds of the limiter. If the output signal, v[n], does not exceed the threshold of the limiter, the limiter is not activated and the signal passes through to the adder 622. In this circumstance, the feedback signal fdbk[n] is equal to output signal, v[n]. If the output signal, v[n], exceeds the thresholds of the limiter, the limiter is activated. When the limiter is activated, the limiter clamps the output signal, v[n], to the threshold value of the limiter. The limiter produces a feedback signal, fdbk[n], which is the clamped output signal, v[n]. The feedback signal, fdbk[n], is then input to adder 622 and combined with the input signal, r[n], and the process is repeated.

When the input signal is very large, the feedback limiter integrator 620 limits the integrator output, v[n], while allowing a signal to still pass through the integrator in the forward signal path. In this way, the present invention degrades the integrator into linear proportion when the limiter is activated. As a result, the method in accordance with the present invention improves the SNDR of the sigma delta modulator when the modulator is experiencing instability.

Figure 8A:
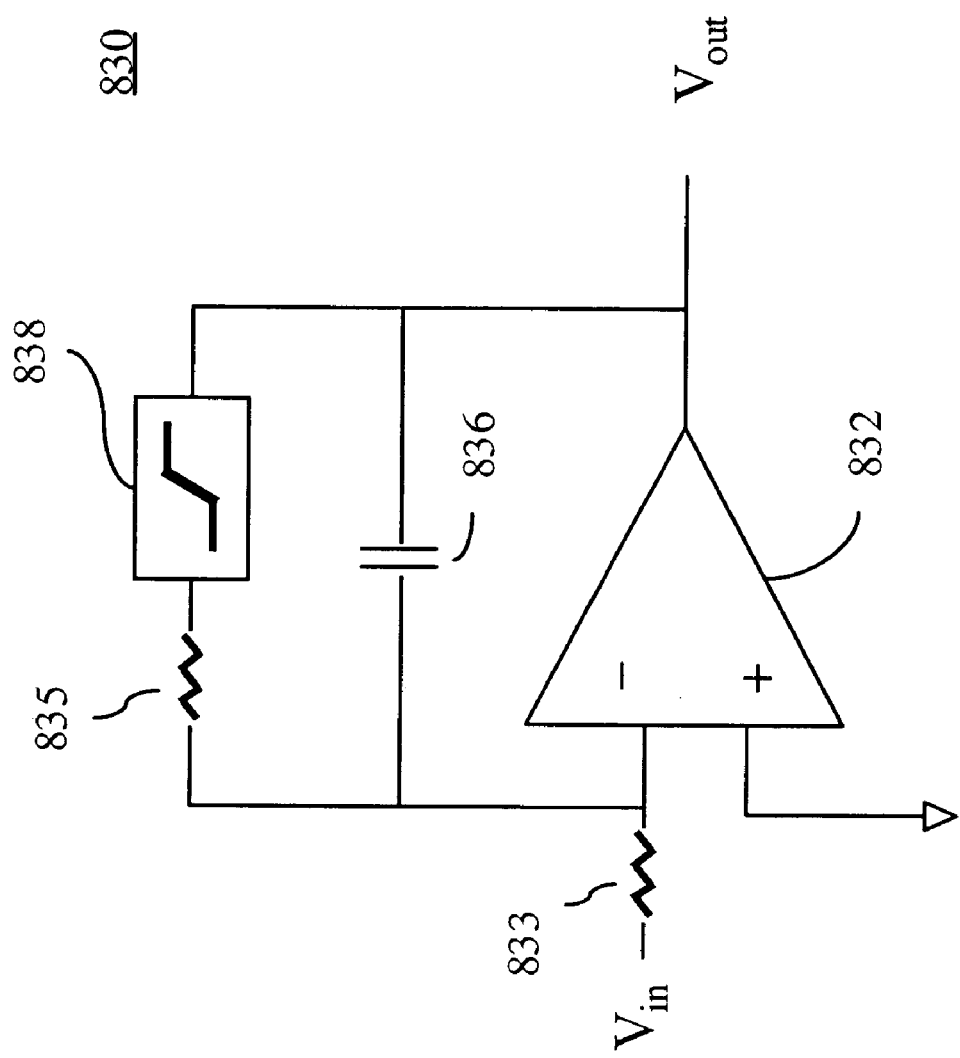
FIGS. 8A and 8B are block diagrams of analog switched capacitor integrators in accordance with embodiments of the present invention.

FIG. 8A depicts a block diagram of a exemplary analog feedback limiter integrator 830. Analog feedback limiter integrator 830 comprises an op amp 832, a capacitor 836, a limiter 838, a first resistor 833, and a second resistor 835. Second resistor 835 is connected in series with limiter 838. Second capacitor 836 is connected between the inverting (negative) terminal of op amp 832 and the output of op amp 832. The second capacitor 836 is connected in parallel to the series combination of the second resistor 835 and limiter 838. The first resistor 833 is connected between the input of the integrator and the inverting terminal of op amp 832. The non-inverting (positive) terminal of op amp 832 is connected to ground. Voltage, $V_{in}$, is applied to the integrator at the input.

Figure 8B:
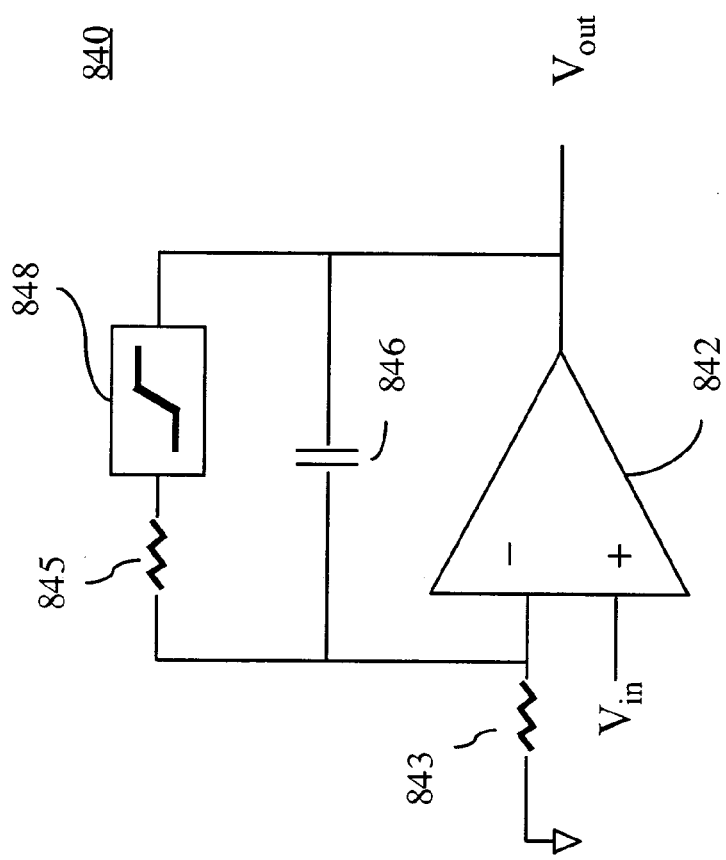

FIG. 8B depicts a block diagram of an alternative analog feedback limiter integrator 840. Analog feedback limiter integrator 840 comprises an op amp 842, a capacitor 846, a limiter 848, a first resistor 843, and a second resistor 845. Second resistor 845 is connected in series with limiter 848. Second capacitor 846 is connected between the inverting (negative) terminal of op amp 842 and the output of op amp 842. The second capacitor 846 is connected in parallel to the series combination of the second resistor 845 and limiter 848. The first resistor 843 is connected between ground and the inverting terminal of op amp 842. The non-inverting (positive) terminal of op amp 842 is connected to input voltage, $V_{in}$.

Figure 9:
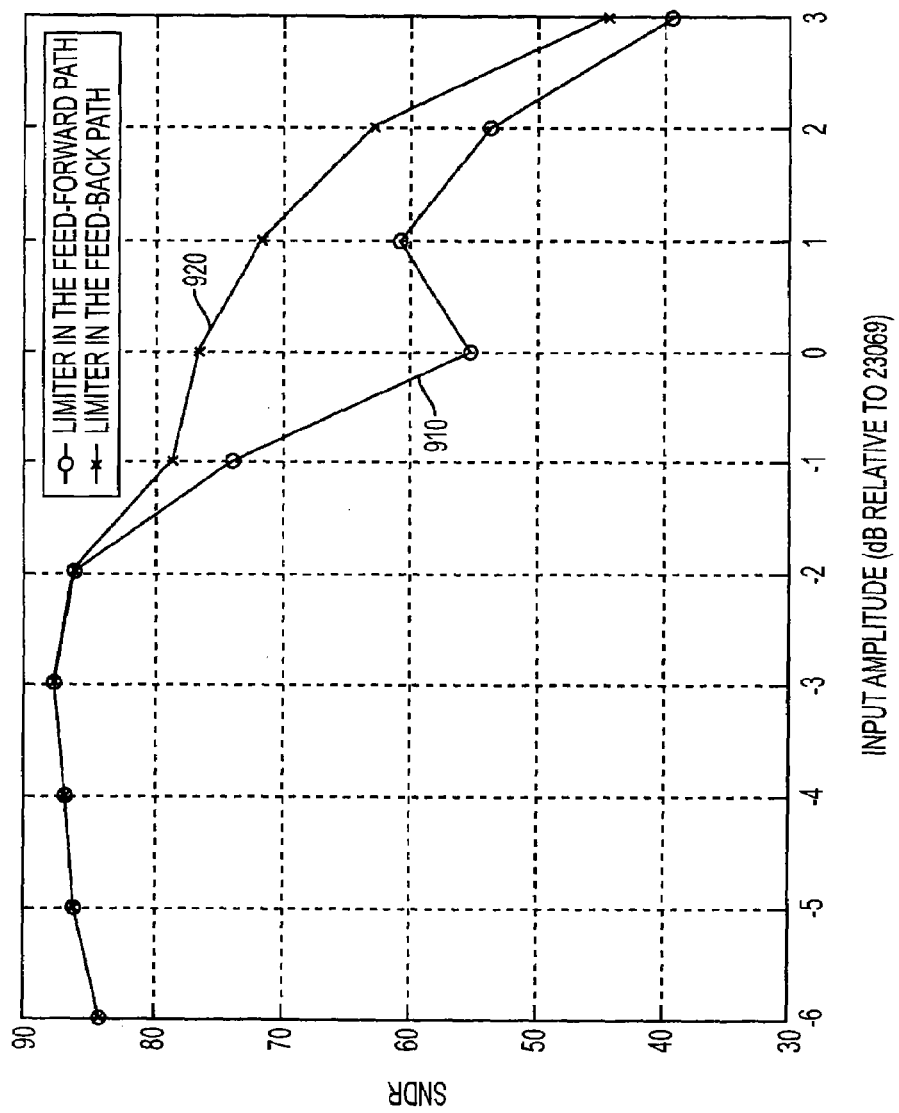
FIG. 9 is a graph of SNDR versus input amplitude for a conventional integrator using a limiter in the feed forward path and an integrator having a limiter in the feedback path in accordance with embodiments of the present invention.

FIG. 9 is a graph of SNDR versus input amplitude. Graph 910 represents a graph of the performance of an integrator having a limiter in the feed forward path according to conventional stabilization techniques. Graph 920 represents a graph of the performance of an integrator having a limiter in the feedback path in accordance with embodiments of the present invention. At low signal levels, the SNDRs are identical for both graphs because the limiters are not yet active. However, when the signal becomes large enough to activate the limiters, the feedback limiter technique depicted in graph 920 shows significantly better SNDR than the conventional stabilizing technique in graph 910.

While various embodiments of the present invention have been described above, it should be understood that they have been presented by way of example, and not limitation. It will be apparent to persons skilled in the relevant art(s) that various changes in form and detail can be made therein without departing from the spirit and scope of the invention. Thus, the present invention should not be limited in any of the above-described exemplary embodiments, but should be defined only in accordance with the following claims and their equivalents.

What is claimed is:

1. A sigma delta modulator comprising:
    at least one integrator, wherein the at least one integrator comprises:
        an operational amplifier having a negative terminal, a positive terminal, and an output, wherein the positive terminal is coupled to a ground;
        a first resistor coupled between an integrator input and the negative terminal of the operational amplifier;
        a capacitor coupled between the negative terminal of the operational amplifier and the output of the operational amplifier;
        a second resistor coupled to the negative terminal of the operational amplifier; and
        a limiter coupled to the second resistor and the output of the operational amplifier.

2. The sigma delta modulator of claim 1 wherein the at least one integrator is a digital integrator.

3. The sigma delta modulator of claim 1 wherein the at least one integrator is an analog integrator.

4. The sigma delta modulator of claim 3 wherein the at least one integrator is a switched capacitor integrator.

5. A sigma delta modulator comprising:
    at least one integrator, wherein the at least one integrator comprises:
        an operational amplifier having a negative terminal, a positive terminal, and an output, wherein the positive terminal is coupled to an integrator input;
        a first resistor coupled between a ground and the negative terminal of the operational amplifier;
        a capacitor coupled between the negative terminal of the operational amplifier and the output of the operational amplifier;
        a second resistor coupled to the negative terminal of the operational amplifier; and
        a limiter coupled to the second resistor and the output of the operational amplifier.

6. The sigma delta modulator of claim 1 wherein the sigma delta modulator has at least three integrators.

7. The sigma delta modulator of claim 6 wherein the sigma delta modulator has a feed forward topology.

8. The sigma delta modulator of claim 6 wherein the sigma delta modulator has a multiple feedback topology.

9. The sigma delta modulator of claim 6 wherein the sigma delta modulator has a cascaded topology.

10. A high-order single-loop sigma delta modulator, comprising:
    a plurality of integrators arranged along a forward signal path between a modulator input and modulator output; and
    a quantizer arranged between said integrators and the modulator output;

wherein at least one of said integrators includes a limiter arranged in an integrator feedback path parallel to a forward signal path through the integrator, wherein the at least one integrator includes an operational amplifier in the forward signal path, and a resistor coupled in series to said limiter in the integrator feedback path, and wherein the integrators include first, second and third integrators arranged in a multiple feed forward topology, each integrator having an input and output, and further comprising:

a first summing node arranged along the signal path between the modulator input and an input of said first integrator, said first summing node being further coupled to a modulator feedback path in parallel with the signal path between the modulator output and the first summing node; and a second summing node coupled between the output of said third integrator output and an input to said quantizer.

11. The sigma delta modulator of claim 10, further comprising:

a first amplifier coupled between the output of the first integrator and said second summing node;

a second amplifier coupled between the output of the second integrator and said second summing node; and a third amplifier arranged along the modulator feedback path between the modulator output and the first summing node.

12. The sigma delta modulator of claim 10 wherein the at least one integrator includes an adder and a delay in the forward signal path, the delay being coupled between the adder and the integrator output in the forward signal path, and said limiter being coupled between the adder and the integrator output in the integrator feedback path.

13. A high-order single-loop sigma delta modulator, comprising:

a plurality of integrators arranged along a forward signal path between a modulator input and modulator output; and a quantizer arranged between said integrators and the modulator output;

wherein at least one of said integrators includes a limiter arranged in an integrator feedback path parallel to a forward signal path through the integrator, wherein the at least one integrator includes an operational amplifier in the forward signal path, and a resistor coupled in series to said limiter in the integrator feedback path, and wherein said integrators include first, second and third integrators arranged in a multiple feedback topology, each integrator having an input and output, and further comprising:

a first summing node arranged along the signal path between the modulator input and an input of said first integrator, said first summing node being further coupled to a first modulator feedback path in parallel with the signal path between the modulator output and the first summing node;

a second summing node arranged along the signal path between the first and second integrators, said second summing node being further coupled to the first modulator feedback path and to a second modulator feedback path in parallel with the signal path between the output of the third integrator and the second summing node; and a third summing node arranged along the signal path between the second and third integrators, said third summing node being further coupled to the first modulator feedback path.

14. The sigma delta modulator of claim 13, further comprising:

a first amplifier coupled between the output of the first integrator and said second summing node;

a second amplifier coupled between the output of the second integrator and said third summing node;

a third amplifier arranged along the first modulator feedback path between the modulator output and the first summing node; and a gain amplifier arranged along the second modulator feedback path in parallel with the signal path between the output of the third integrator and the second summing node.

* * * * *

UNITED STATES PATENT AND TRADEMARK OFFICE
CERTIFICATE OF CORRECTION

PATENT NO.       : 7,123,177 B2                                Page 1 of 3
APPLICATION NO. : 10/640633
DATED            : October 17, 2006
INVENTOR(S)      : Michael N. Haynes and Pamela E. Haynes It is certified that error appears in the above-identified patent and that said Letters Patent is hereby corrected as shown below:

On Title Page Item 60 should read

Related U.S. Application Data

This application is a continuation application of United States Patent Application Serial Number 09/714,452, filed 17 November 2000, and titled "Method for Managing a Parking Lot", now United States Patent No. 6,816,085.

Item 56 please add

References Cited

U.S. Patent Documents

| Patent No. | Date | Inventor |
|---|---|---|
| 4603390 | July 1986 | Mehdipour |
| 5170352 | December 1992 | McTamaney |
| 5410346 | April 1995 | Saneyoshi |
| 5432508 | July 1995 | Jackson |
| 5448487 | September 1995 | Arai |
| 5497314 | March 1996 | Novak |
| 5642431 | June 1997 | Poggio |
| 5648906 | July 1997 | Amirpanahi |
| 5675661 | October 1997 | Richman |
| 5675663 | October 1997 | Koerner |
| 5689442 | November 1997 | Swanson |
| 5699449 | December 1997 | Javidi |
| 5703964 | December 1997 | Menon |
| 5712830 | January 1998 | Ross |
| 5745052 | April 1998 | Matsuyama |
| 5748107 | May 1998 | Kersken et al. |
| 5764852 | June 1998 | Williams |
| 5774129 | June 1998 | Poggio |
| 5828769 | October 1998 | Burns |
| 5842162 | November 1998 | Fineberg |
| 5842194 | November 1998 | Arbuckle |
| 5845268 | December 1998 | Moore |
| 5850470 | December 1998 | Kung |
| RE36041 | January 1999 | Turk |
| 5864305 | January 1999 | Rosenquist |
| 5877969 | March 1999 | Gerber |
| 5901246 | May 1999 | Hoffberg |
| 5901660 | May 1999 | Stein |

UNITED STATES PATENT AND TRADEMARK OFFICE
CERTIFICATE OF CORRECTION

PATENT NO. : 7,123,177 B2  
APPLICATION NO. : 10/640633  
DATED : October 17, 2006  
INVENTOR(S) : Michael N. Haynes and Pamela E. Haynes It is certified that error appears in the above-identified patent and that said Letters Patent is hereby corrected as shown below:

Item 56 please add

Reference Cited

U.S. Patent Documents [continued from page 1]

| Patent No. | Date | Inventor |
|---|---|---|
| 5912980 | June 1999 | Hunke |
| 5920477 | July 1999 | Hoffberg |
| 5923791 | July 1999 | Hanna |
| 5940481 | August 1999 | Zeitman |
| 5946675 | August 1999 | Sutton |
| 5963670 | October 1999 | Lipson |
| 5974175 | October 1999 | Suzuki |
| 5982934 | November 1999 | Villalba |
| 5983161 | November 1999 | Lemelson |
| 5986357 | November 1999 | Myron |
| 5987154 | November 1999 | Gibbon |
| 5991429 | November 1999 | Coffin |
| 6006175 | December 1999 | Holzrichter |
| 6006181 | December 1999 | Buhrke |
| 6006185 | December 1999 | Immarco |
| 6009390 | December 1999 | Gupta |
| 6011854 | January 2000 | Van Ryzin |
| 6014468 | January 2000 | McCarthy |
| 6058352 | May 2000 | Lu |
| 6081750 | June 2000 | Hoffberg |
| 6092919 | July 2000 | Calise |
| 6107942 | August 2000 | Yoo et al. |
| 6134525 | October 2000 | Iwahashi |
| 6144910 | November 2000 | Scarlett |
| 6285297 | September 2001 | Ball |
| 6292110 | September 2001 | Budnovitch |
| 6340935 | January 2002 | Hall |
| 6501391 | December 2002 | Racunas, Jr. |
| 6570608 | May 2003 | Tserng |

UNITED STATES PATENT AND TRADEMARK OFFICE
CERTIFICATE OF CORRECTION

PATENT NO. : 7,123,177 B2
APPLICATION NO. : 10/640633
DATED : October 17, 2006
INVENTOR(S) : Michael N. Haynes and Pamela E. Haynes It is certified that error appears in the above-identified patent and that said Letters Patent is hereby corrected as shown below:

Item 56 please add

Other References

Print-out from http://www.fastoll.com/smart.htm, printed Feb. 8, 2001, 1 page. .
Print-out from http://www.eyecast.com, printed Jan. 10, 2000, 12 pages. .
Noguchi, Yuki, "The View From the Bridge--and Beltway", Washington Post, Business section, p. 9, Jan. 10, 2000.

Signed and Sealed this

Twentieth Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 7,123,177 B2  Page 1 of 1
APPLICATION NO. : 10/640633
DATED : October 17, 2006
INVENTOR(S) : Taiyi Cheng et al.

It is certified that error appears in the above-identified patent and that said Letters Patent is hereby corrected as shown below:

This certificate supersedes the Certificate of Correction issued May 20, 2008. The certificate should be vacated since no Certificate of Correction was granted for this patent number.

Signed and Sealed this

Twenty-second Day of July, 2008

JON W. DUDAS
*Director of the United States Patent and Trademark Office*